United States Patent [19]
Okamoto et al.

[11] Patent Number: 5,167,161
[45] Date of Patent: Dec. 1, 1992

[54] AUTOMATIC DEFECT DETECTING/CORRECTING SYSTEM OF TAPE-MOUNTED ELECTRONIC COMPONENTS ASSEMBLY

[75] Inventors: Yoshio Okamoto; Akinori Kikuchi, both of Nagaokakyo, Japan

[73] Assignee: Murata Manufacturing Co., Ltd., Kyoto, Japan

[21] Appl. No.: 668,096

[22] Filed: Mar. 12, 1991

[30] Foreign Application Priority Data

Mar. 13, 1990 [JP] Japan .................................. 2-62214

[51] Int. Cl.⁵ .......................................... B65H 20/34
[52] U.S. Cl. .................................. 73/865.9; 226/118; 226/119
[58] Field of Search .................. 226/10, 48, 118, 119; 73/865.9

[56] References Cited

U.S. PATENT DOCUMENTS

| | | | |
|---|---|---|---|
| 3,501,076 | 3/1970 | Stuart et al. | 226/118 |
| 3,827,617 | 8/1974 | Anderson | 226/118 |
| 3,993,233 | 11/1976 | Bartell | 226/118 |
| 4,058,265 | 11/1977 | Hedlund et al. | 226/118 |
| 4,215,827 | 8/1980 | Roberts et al. | 226/118 |
| 4,367,832 | 1/1983 | Fabian et al. | 226/118 |
| 4,967,222 | 11/1990 | Nitsch | 226/119 |
| 4,975,723 | 12/1990 | Hammerquist et al. | 226/119 |
| 5,050,812 | 9/1991 | Mueller | 226/119 |

Primary Examiner—Tom Noland
Assistant Examiner—Howard Wisnia
Attorney, Agent, or Firm—Wenderoth, Lind & Ponack

[57] ABSTRACT

The present invention provides an automatic defect detection and correction system for a tape-mounted electronic components assembly which allows detection and correction of various types of defects in the production of a tape-mounted electronic components assembly without interrupting operation of a taping machine. A storing section allows storage of a length of tape coming out of the taping machine. A defect detecting section detects various types of defects of the tape coming out of the storing section. A defect correcting section enables correction of detected defects, and a take-up section winds the corrected tape on a reel. The tape coming out of the taping machine is continually wound between a fixed shaft and a movable shaft in the storing section and is thus temporarily stored in a specified length. When the tape leaves the storing section for the defect detecting section and the defect correction section, the movable shaft approaches the fixed shaft, forwarding the temporarily stored tape. When the tape stops at the defect correcting section, the movable shaft moves away from the fixed shaft, storing the tape from the taping machine. As a result, uninterrupted operation of the taping machine is made possible.

6 Claims, 3 Drawing Sheets

AUTOMATIC DEFECT DETECTING/CORRECTING SYSTEM OF TAPE-MOUNTED ELECTRONIC COMPONENTS ASSEMBLY

FIELD OF THE INVENTION

The present invention relates to an automatic defect detecting/correcting system of a tape-mounted electronic components assembly provided to automatically detect various types of defects in the production process of a tape-mounted electronic components assembly to be used for automatic mounting of small electronic components on a printed circuit board, etc., correct such detected defects and wind the tape on a specified reel.

PRIOR ART

FIG. 6 shows an example of a tape-mounted electronic components assembly (hereinafter to be abbreviated as "Tape A"), wherein numeral 1 is a tape-like body consisting of cardboard or plastics, number 2 is a large number of housing concavities formed in the body 1 at regular intervals, numeral 3 refers to chip resistors and other small electronic components housed in the concavities 2, and numeral 4 is a top film consisting of an adhesive tape applied on the body 1.

Furthermore, tape feeding perforations 5 are formed at one side of the body 1 at regularly intervals.

Tape "A" as described above automatically houses a small electronic component 3 in each concavity 2 of the body 1 by means of a taping machine, has a top film 4 applied thereon and is then wound on a specified reel. In this case, however, if any defect is found, it must be manually corrected.

PROBLEMS TO BE SOLVED BY THE INVENTION

Defect correction of Tape "A" as described above has conventionally been performed after a tape produced by a taping machine, fed out and wound on a reel, has been transferred to a different place. Manually detection for various types of defects then takes place, thereby making it necessary to secure personnel and space only for defect detecting/correcting purposes.

Furthermore, the defect detecting/correcting level differs depending upon differences in skill of the defect detecting/correcting personnel, in the timing of defect detection, etc., and defective products may be shipped as conforming products.

Still furthermore, because there is a time lag (of about 1 day to 0.5 days) between the component taping process and the defect detection/correction process, there have been problems such that continuous occurrence of defects due to the malfunction of a component taping machine are not quickly dealt with.

Accordingly, it is an object of the present invention to provide an automatic defect detecting/correcting system of a tape-mounted electronic components assembly designed to detect and correct defects during the period between the time when a tape-mounted electronic components assembly exits a taping machine and the time when it is wound at a tape-up section, and also designed to decrease chances of overlooking defective portions of a tape-mounted electronic components assembly, to eliminate the necessity of defect detecting-/correcting personnel and space, and to improve on the operating rate of a taping machine so that these problems with the conventional defect detecting/correcting method of a tape-mounted electronic components assembly as described above can be solved.

SUMMARY OF THE INVENTION

In order to solve such problems as above, the present invention consists of a storing section in which a tape-mounted electronic components assembly coming out of a taping machine is temporarily stored in a specified length, a defect detecting section which detects various defects of a tape-mounted electronic components assembly coming out of the storing section, a defect correcting section which corrects defects detected by the defect detecting section, and a take-up section which winds a defect detected/corrected tape-mounted electronic components assembly on a specified reel. The storing section adopts such a configuration that a storing length of a tape-mounted electronic components assembly is made longer by providing a plurality of rollers each with parallel shafts designed to come close to and depart from each other by an appropriate drive means, winding a tape-mounted electronic components assembly going towards the defect detecting section from the taping machine, on each roller several turns, and making both parallel shafts depart from the position where they were made to come close.

DETAILED DESCRIPTION OF THE PREFERRED EMBODIMENTS

The preferred embodiments of an automatic defect detecting/correcting system of a tape-mounted electronic components assembly according to the present invention will be hereinafter explained with reference to FIG. 1 thru FIG. 6 of the accompanying drawings.

Figure 1:
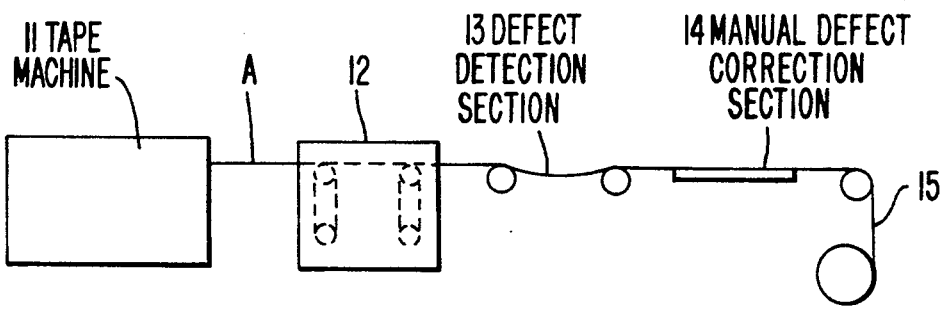
FIG. 1 is a side elevational view showing an automatic defect detecting/correcting system of a tape-mounted electronic components assembly according to the present invention.

As illustrated in FIG. 1 an automatic defect detecting/correcting system of a tape-mounted electronic components assembly comprises of a storing section 12 where Tape "A" coming out of a taping machine 11 is temporarily stored in a fixed length, a defect detecting section 13 which detects various types of defects of the Tape "A" coming out of the storing section 12, a defect correcting section 14 which corrects the defects detected in the defect detecting section 13, and a take-up section 15 where the defect-detected/corrected Tape "A" is wound on a specified reel.

Figure 2:
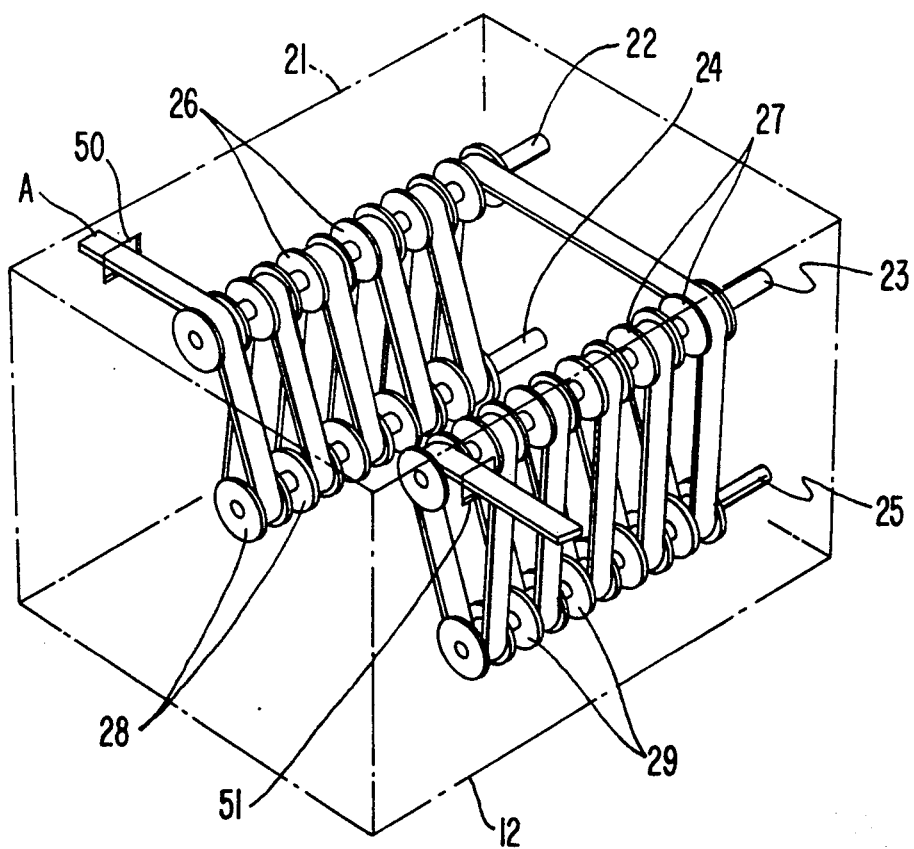
FIG. 2 is an enlarged perspective view of a first embodiment of a storing section.

As shown in FIG. 2, a first embodiment of the storing section 12 is such that a pair of fixed shafts 22 and 23 are arranged in horizontal, parallel and upper positions of the case 21, with horizontal movable shafts 24 and 25 being arranged under the shafts 22 and 23, respectively.

Each movable shaft 24 and 25 is lifted by means of an appropriate drive means so that they come close to and move away from the fixed shafts 22 and 23 in the upper section of the case.

Tape "A" can be temporarily stored in a specified length by providing each shaft 22, 23, 24 and 25 with a plurality of rollers 26, 27, 28 and 29 in a freely rotatable manner, winding Tape "A" going towards the defect detecting section 13 from the taping machine 11 on each of the rollers 26, 27, 28 and 29 several turns in the same direction, and allowing each pair of shafts 22 and 24, and 23 and 25, to move away from the positions of the corresponding pair of shafts.

Either of the rollers 26 and 28 at the input side transmits a signal to the means of the movable shafts 24 and 25 when Tape "A" is fed from the taping machine 11, serving as detecting rollers at the input side which allow the movable shafts 24 and 25 to be simultaneously lowered from a lifted position.

When defect detection, by examination of the exterior of a tape is started, Tape "A" is sent out from the output side. Either of the rollers 27 and 29 at the output side detects this process and transmits a signal to the drive means of the movable shafts 24 and 25 in order to serve as detecting rollers at the output side which allow the movable shafts 24 and 25 to be lifted.

Figure 3:
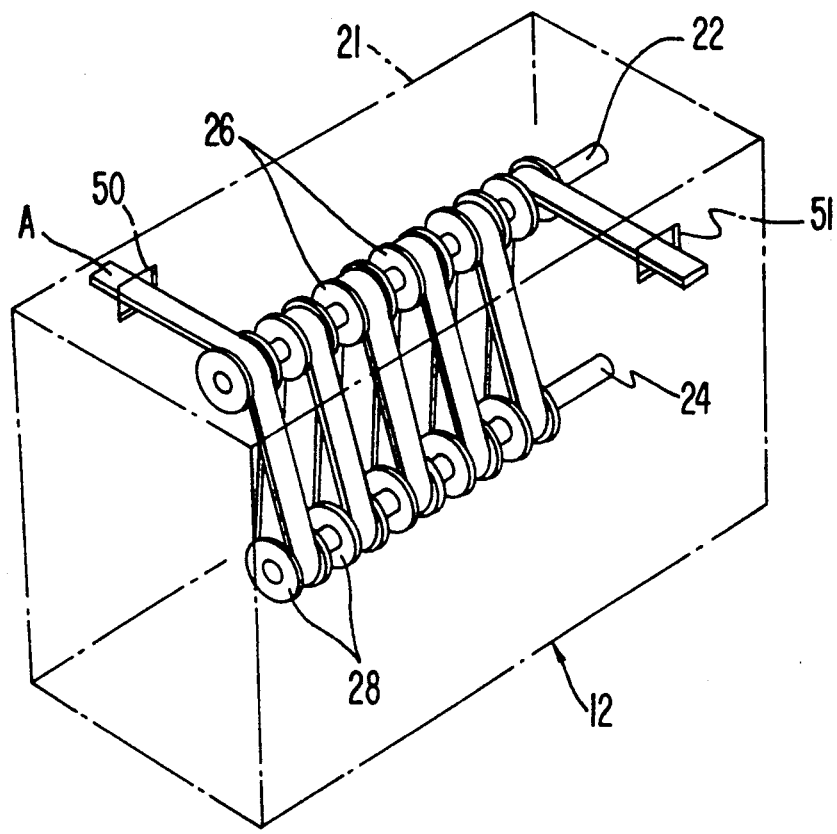
FIG. 3 is an enlarged perspective view of a second embodiment of the storing section.

FIG. 3 illustrates a second embodiment of the storing section 12, which has a configuration such that a fixed shaft 22 and a movable shaft 24 are arranged as a set in the upper and lower positions of the case 21, respectively. The movable shaft 24 can approach or move away from the fixed shaft 22 in a horizontal condition by means of an appropriate vertical drive means. Tape "A" is wound, in order, on a plurality of rollers 26 and 28 provided on the fixed shaft 22 and also on the movable shaft 24 so that Tape "A" is temporarily stored in a specified length.

In this second embodiment, a sensor at the output side is provided at a roller at the outlet end of either the fixed shaft 22 or the movable shaft 24.

The number of sets of fixed shafts and movable shafts to be provided in the storing section 12 is not limited to the numbers illustrated in the first and second embodiments, and a multiple number of sets may be acceptable. The larger the number of sets of fixed shafts and movable shafts becomes, the longer the length of Tape "A" that can be temporarily stored.

The number of sets of fixed shafts 22 and movable shafts 24 is preferably even, which allows Tape "A" to be aligned in line at the inlet and outlet of the storing section, thus providing a spatial advantage.

Furthermore, the sensor to be provided at each of the input and output sides of the Tape "A" is not necessarily required to be provided on the fixed shaft 22 and the movable shaft 24. A detecting roller or sensor may be separately provided.

In the storing section 12 as described above, the idea that a tape-mounted electronic components assembly "A" is wound between the fixed shaft 22 and the movable shaft 24 in the same direction is extremely useful for the tape-mounted electronic components assembly "A".

Figure 6:
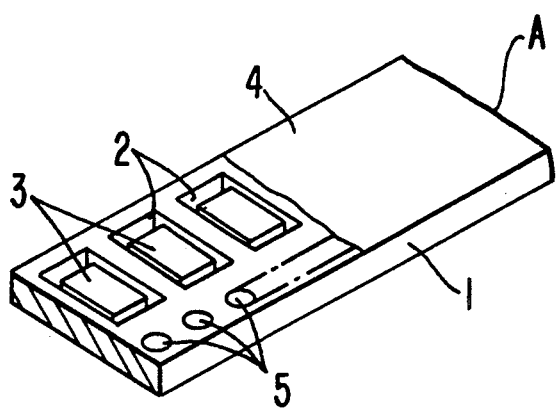
FIG. 6 is an enlarged, partially cutaway view in perspective of an example of a known tape-mounted electronic components assembly.

As shown in FIG. 6, a tape-mounted electronic components assembly "A" houses chip-like small electronic components 3 in concavities 2 of a tape-like body 1, with a top film 4 being applied over the entire top surface of the tape-like body 1 or with perforations 5 avoided. Therefore, when a tape-mounted electronic components assembly "A" is wound around the fixed shafts 22 an 23 and the movable shafts 24 and 25 of the storing section 12 in the same direction, the top film 4 will always be positioned along the outer periphery, thereby allowing the top film 4 to always be pushed against the tape-like body 1. As a result, dislocation of the tope film 4 can be eliminated, and damage to the tape-like body 1 can be prevented accordingly.

Furthermore, when a tape-like body is made of cardboard and its folding direction is not constant, peeling of the tape-like body 1 takes place, resulting in defects. However, when it is folded in only one fixed direction, such peeling can be prevented.

Still furthermore, when a tape-mounted electronic components assembly "A" is folded in only the fixed direction, it will be necessary to form perforations 5 only on one side of the tape-like body 1, thereby making it possible to apply a top film 4 on the entire top surface with an adhesive. As a result, such advantages as increased productivity and firm adhesion of the top film 4 on a tape are obtained.

Figure 4:
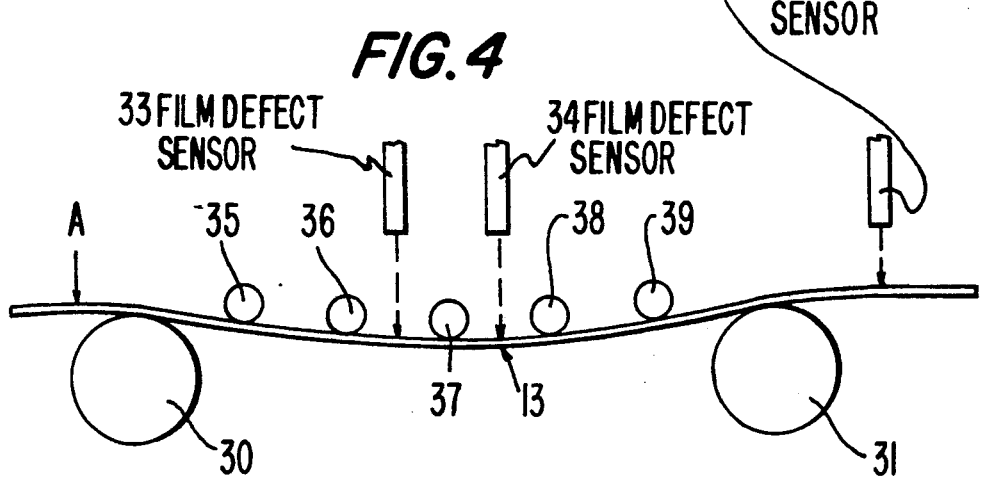
FIG. 4 is an enlarged side view of a defect detecting section.
Figure 5:
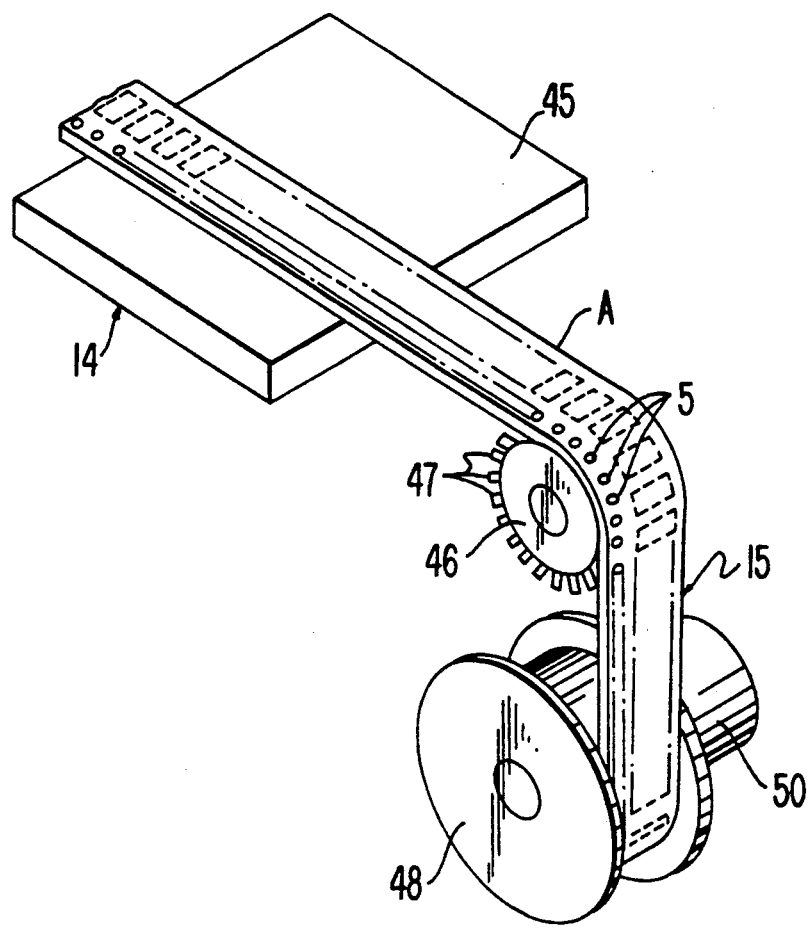
FIG. 5 is an enlarged perspective view of a defect correcting section.

FIG. 4 shows details of a defect detecting section 13, wherein numerals 30 and 31 are tape feed rollers, either of which is to be provided with a backstop clutch (not shown).

Numerals 33 and 34 are a pair of front and rear film defect sensors. Tape "A" between the feed rollers 30 and 31 is bent downwards by a plurality of, for example five, guide rollers 35, 36, 37, 38 and 39, thus forming a circular arc. The numeral 41 is a sensor for detecting defects and positional failure of components.

The defect correcting section 14 as described above comprises, as shown in FIG. 5, a flat plate 45. Tape "A" passes across this flat plate 45 and through a sprocket 46 for tape drive, and is then wound on a take-up reel 48.

On the outer periphery of the sprocket 46, a plurality of projections 47 are provided for engagement with perforations 5 of Tape "A" so that Tape "A" can be wound on the take-up reel 48 with no slippage.

Furthermore, the reel 48 is driven by a torque motor (not shown) so that undue force is not imposed on Tape "A" even when the travel of Tape "A" is stopped for defect correcting work, etc.

In the aforementioned embodiments, when Tape "A" is fed out of a taping machine 11 into a case 21 through the inlet hole 50 of the case 21 shown in FIG. 2, a detecting roller at the input side detects this process. The movable shafts 24 and 25 start lowering at the same time and after Tape "A" is wound, while curving in the same direction, on each roller 26 of the fixed shaft 22, provided in the upper section of the case 21 at the input side, and also on each roller 28 of the movable shaft 24 provided in the lower section of the case 21 at the input side. While curving in the same direction, the Tape "A" is further wound on each roller 27 of the fixed shaft 23 provided in the upper section of the case 21 at the output side and also on each roller 29 of the movable shaft 25 provided in the lower section at the output side, thus storing Tape "A" in the storing section.

When defect detection by examination of the exterior of the tape is started and Tape "A" advances towards the defect detecting section 13 through the outlet hole 51, the detecting roller at the output side detects the advance. This causes the movable shafts 24 and 25 to start lifting. Tape "A" is formed into a circular arc by the rollers 35 thru 39 between the feed rollers 30 and 31 of the defect detecting section 13, and the tape passes through the defect correcting section 14 and the sprocket 46, and is then wound on the reel 48.

In the aforementioned defect detecting section 13, adhesion failure of the top film 4 is detected by light reflection from a raised area of the film 4 of the defective components, with sensors 33 and 34 being reflective optical sensors and the top film 4 a transparent body.

When a defect is detected, it is necessary to stop this defective portion of Tape "A" on the flat plate 45 of the defect correcting section 14, for subsequent correction thereof.

At this time, the take-up reel 48 and the sprocket 46 are caused to stop.

Thus, the taping machine 11 is still operating even when Tape "A" is caused to stop, and Tape "A" can be temporarily stored in the storing section 12 by allowing the movable shafts 24 and 25 of the storing section 12 to gradually lower during this period.

When defect correction is completed, the sprocket 46 is rotated to again wind up Tape "A" on the take-up reel 48.

In operation, the tape-mounted electronic components assembly coming out of the taping machine 11 is fed into the storing section 12.

When the sensor detects that the tape-mounted electronic components assembly has been fed into the storing section 12, the distance between parallel shafts 22 and 24 and 23 and 25 of the storing section becomes gradually larger, whereby the tape-mounted electronic components assembly which is wound onto each roller of the parallel shafts in a curved condition, and in the same direction, which will be fed to the defect detecting section 13, is gradually and temporarily stored in the storing section 12.

When a defect detection is started, causing the tape-mounted electronic components assembly to exit the outlet 51 of the storing section, this process is detected by a sensor, causing the parallel shafts to start approaching each other. As a result, the tape-mounted electronic components assembly temporarily stored in the storing section 12 moves towards the defect detecting section 13. The tape-mounted electronic components assembly which has passed through the defect detecting section 13 then moves on towards the defect correcting section.

In the defect correcting section 14, various types of defects are manually corrected, and while the defects are being corrected, this portion of the tape-mounted electronic components assembly must be brought to a stop.

However, while a tape-mounted electronic component is stopped in the defect correcting section 14, the Tape "A" is still being continuously fed into the storing section 12 from the taping machine 11. Since the distance between the parallel shafts in the storing section 12 is gradually made larger during this period so that the tape-mounted electronic components assembly is temporarily stored, it is not necessary to stop the taping machine 11.

When defect correction of the tape-mounted electronic components assembly is completed in the defect correcting section 14 and the tape-mounted electronic components assembly is wound on take-up reel 48 of the tape take-up section 15, the parallel shafts in the storing section 12 gradually approach each other, thereby forwarding the tape-mounted electronic components assembly of the storing section 12.

The present invention provides the advantages enumerated below through the configuration and operation as described above.

An automatic defect detecting/correcting system of a tape-mounted electronic components assembly according to the present invention is so configured that a tape-mounted electronic components assembly exiting a taping machine is temporarily stored in a storing section. Defects are detected in the defect detecting section such that when a defect is detected, it is corrected in the defect correction section, and the tape then wound at the take-up section. Therefore, in comparison with the conventional method of detecting and correcting defects at a different location, the present invention provides the advantage of reducing the possibility that defective components are overlooked and shipped. Furthermore, it also offers the further advantage of reducing the number of defect detecting/correcting personnel.

A still further advantage is that, as the tape-mounted electronic components assembly is continued to be temporarily stored in the storing section, it is not necessary to stop the taping machine even when the tape is temporarily stopped for defect correction, take-up reel change or other purposes, thus improving the operating rate of the taping machine.

What is claimed is:

1. A defect detection and correction system for tape-mounted chip assemblies, comprising:

a taping means for producing a tape-mounted chip assembly including a tape-like cardboard body having a top surface a plurality of chips thereon at regular intervals and a top film on said top surface;

a storage section for receiving, storing and forwarding lengths of the tape-mounted chip assembly produced by said taping means;

defect detecting means for detecting defects in the tape-mounted chip assembly forwarded by said storage section;

a defect correcting section receiving the tape-mounted chip assembly from said defect detecting means for enabling correction of defects in the tape-mounted chip assembly detected by said detecting means; and a take-up section receiving the tape-mounted chip assembly from said defect correcting section, said take-up section having a reel for winding the tape-mounted chip assembly thereon;

wherein said storage section has two parallel shafts, a drive means for relatively moving said two parallel shafts toward and away from each other, and a plurality of rollers on said parallel shafts, the tape-mounted chip assembly being received in said storage section, wound around said rollers in the same direction such that said top film always faces away from said rollers and forwarded to said defect detecting means, whereby the amount of the tape-mounted chip assembly stored by said storage section can be increased or decreased by moving said two parallel shafts away from or toward each other, respectively.

2. The system of claim 1, wherein said storage section has two additional said parallel shafts, said drive means also relatively moving the additional said parallel shafts, the additional said parallel shafts having further said rollers thereon and the tape-mounted chip assembly also being wound around the further said rollers.

3. The system of claim 1, and further comprising feed detecting means at said storage section for detecting the feed of the tape-mounted chip assembly into said storage section from said taping means and out of said storage section to said defect detecting means and controlling the operation of said drive means to move said parallel shafts toward and away from each other.

4. The system of claim 1, wherein said defect detecting means comprises a plurality of rollers for contacting the tape-mounted chip assembly and a pair of sensors detecting light reflection from the top film of the tape-mounted chip assembly.

5. The system of claim 1, wherein said defect correcting section comprises a flat plate.

6. An apparatus, comprising:
   taping means for producing a tape-mounted electronic component assembly;
   storage means for receiving the tape-mounted electronic component assembly from said taping means, storing a variable length of the assembly, and forwarding the assembly, said storage means comprising first and second parallel shafts, a plurality of rollers on said shafts, means for relatively moving said shafts, and means for detecting receipt of the assembly from said taping means and forwarding of the assembly, said means for detecting controlling said means for relatively moving;
   defect detecting means or detecting defects in the assembly forwarded by said storage means;
   a defect correcting section for receiving the assembly from said defect detecting means and enabling manual correction of defects; and
   a take-up section for receiving the assembly from said defect correction section.

* * * * *